US006958288B2

(12) United States Patent
Tokunaga

(10) Patent No.: US 6,958,288 B2
(45) Date of Patent: Oct. 25, 2005

(54) SEMICONDUCTOR DEVICE AND MANUFACTURING METHOD THEREOF

(75) Inventor: Kenji Tokunaga, Hachioji (JP)

(73) Assignee: Trecenti Technologies, Inc., Ibaraki (JP)

( * ) Notice: Subject to any disclaimer, the term of this patent is extended or adjusted under 35 U.S.C. 154(b) by 0 days.

(21) Appl. No.: 10/853,255

(22) Filed: May 26, 2004

(65) Prior Publication Data

US 2004/0238968 A1 Dec. 2, 2004

(30) Foreign Application Priority Data

May 30, 2003 (JP) ..................................... P2003-153613

(51) Int. Cl.[7] .......................... H01L 21/44; H01L 21/48; H01L 21/50; H01L 21/4763
(52) U.S. Cl. ........................ 438/622; 438/106; 438/124; 438/128
(58) Field of Search ................................. 438/106–128, 438/622

(56) References Cited

U.S. PATENT DOCUMENTS

2001/0045651 A1 * 11/2001 Saito et al. .................. 438/648

2003/0020163 A1 * 1/2003 Hung et al. .................. 257/734

FOREIGN PATENT DOCUMENTS

| JP | 11340319 A | 5/1998 |
|----|------------|--------|
| JP | 2001267323 A | 3/2000 |

* cited by examiner

Primary Examiner—Cuong Nguyen
(74) Attorney, Agent, or Firm—Reed Smith LLP; Stanley P. Fisher, Esq.; Juan Carlos A. Marquez, Esq.

(57) ABSTRACT

In a semiconductor device manufacturing process using a low-dielectric-constant insulation film as an interlayer insulation film, a stress exerted on wiring layers and interlayer insulation films is reduced. In a semiconductor device in which a plurality of buried wiring layers are formed in the interlayer insulation films each formed of a low-dielectric-constant insulation film lower in mechanical strength than a silicone oxide film formed by, for example, a CVD method, a first layer of wiring, on a lower layer of which a low-dielectric-constant insulation film is not disposed, serves as a bonding pad, and bump electrodes are formed on the wiring so as to become higher than a position where the uppermost buried wiring is formed.

7 Claims, 19 Drawing Sheets

SEMICONDUCTOR DEVICE AND MANUFACTURING METHOD THEREOF

CROSS-REFERENCE TO RELATED APPLICATION

The present application claims priority from Japanese patent application No. JP 2003-153613 filed on May 30, 2003, the content of which is hereby incorporated by reference into this application.

BACKGROUND OF THE INVENTION

The present invention relates to a semiconductor device and a manufacturing technique thereof and, particularly, to a technique effectively applied to manufacture of a semiconductor device having an interlayer insulation film with low dielectric constant between wiring layers.

For example, in a semiconductor device including an organic insulation film with low dielectric constant and with low hardness and low elasticity as an interlayer insulation film between wiring layers, there is a technique in which, since a dummy wiring and a connection hole are provided under a bonding pad, destruction of the interlayer insulation film and boundary separation between the wiring layers and the interlayer insulation film are prevented at the time of wire bonding to the bonding pad (for example, see Japanese Patent Laid-open No. 2001-267323).

Further, in a semiconductor including an organic insulation film with low dielectric constant, as an interlayer insulation film between wiring layers, which is lower in strength and adhesion properties than an inorganic insulation film, there is a technique in which: an opening corresponding to an electrode pad (bonding pad) is formed in each of a plurality of interlayer insulation films; the respective openings are filled with a metallic material to form a laminated body having metallic-film patterns; the laminated body having the metallic-film patterns is used as the electrode pad; and thereby durability of impact at the time of wire bonding to the electrode pad is improved (for example, see Japanese Patent Laid-open No. 11-340319).

SUMMARY OF THE INVENTION

With high integration of the semiconductor device in recent years, high density of wirings by their microfabrication has been demanded. However, parasitic capacity between the wirings has been increased depending on the high density of the wirings, which leads to delay in sending electric signals. Thus, it is desirable to adopt a material having as low a dielectric constant as possible as the interlayer insulation film between the wiring layers to reduce such parasitic capacity.

The present inventor has been considering a technique for applying, as the insulation film between the above-mentioned wirings and between the wiring layers, an insulation film lower in dielectric constant than an inorganic insulation film such as a silicone oxide film deposited by, for example, a CVD (Chemical Vapor Deposition) method. In the technique, the inventor has found out the following problem.

That is, as an insulation film lower in dielectric constant (hereinafter abbreviated as "low-dielectric-constant insulation film") than an inorganic insulation film such as a silicone oxide film deposited by the CVD method, for example, a MSQ (methyl silsesquioxane) system film, an organic polymer system film, a HSQ (hydrogen silsesquioxane) system film, and porous system films formed of these films are available. Because these low-dielectric-constant insulation films each have relatively low mechanical strength, a strong pulling stress is applied to the wiring layer and the interlayer insulation film due to impact occurring at the time of a bonding step etc. By application of such a pulling stress, there arises the problem of disconnection of the wiring, separation between the wiring and the insulation film, and the like. The problem has a significant tendency to occur, in a semiconductor device having large integrated value in thickness of the low-dielectric-constant insulation film, particularly, in a step of manufacturing a semiconductor device with many wiring layers.

Meanwhile, when individual semiconductor chips (hereinafter simply abbreviated as "chips") are cut off from a semiconductor wafer (hereinafter simply abbreviated as "wafer") and the chips are sealed by a sealing resin, a stress is exerted on each chip from the sealing resin. Due to this stress, there is the problem that the lower-dielectric-constant insulation films are separated from one another between the low-dielectric-constant insulation films to be laminated, and there is the problem that disconnection by stress migration occurs between the wiring layers.

An object of the present invention is to provide a technique, which is capable of reducing the stress exerted on the wiring layer and the interlayer insulation film in a semiconductor device manufacturing step using the low-dielectric-constant insulation film as the interlayer insulation film.

The above and other objects and novel features will be apparent from the description of this specification and the accompanying drawings.

Outlines of representative ones among inventions disclosed in this application will be briefly described as follows.

That is, a semiconductor device according to the present invention is one which has a semiconductor chip, on a main surface of which a plurality of wiring layers are formed, and comprises: a first insulation film formed over said semiconductor chip; a first wiring layer formed over said first insulation film; a second insulation film formed over the first wiring layer; and a second wiring layer separated from said first wiring layer by said second insulation film formed over said first wiring layer, wherein said first wiring layer includes a bonding pad and said second insulation film has a relatively lower dielectric constant than that of said first insulation film.

Further, a manufacturing method of a semiconductor device according the present invention comprises the steps of:

(a) forming a first insulation film over a semiconductor substrate;

(b) forming a first wiring layer over said first insulation film;

(c) forming, over said first wiring layer, a second insulation film lower in dielectric constant than said first insulation film;

(d) forming a second wiring layer over said second insulation film;

(e) removing said second insulation film within a first region surrounding said second wiring layer in plane, and using a bonding pad as a first wiring formed in said first region of said first wiring layer;

(f) forming, over said bonding pad, a bump electrode electrically connected to said bonding pad;

(g) after said step (f), cutting said semiconductor substrate along a division region to form individual semiconductor chips;

(h) preparing an insulation tape, on a main surface of which a lead is formed, opposing a main surface of said semiconductor chip and said main surface of said insulation tape to each other, and disposing said semiconductor chip on said insulation tape so that said bump electrode is electrically connected to said lead; and (i) resin-sealing rear and side surfaces of said semiconductor chip so that said main surface of said semiconductor chip comes in no contact with a sealing resin under the condition that said semiconductor chip is disposed on said insulation tape.

DESCRIPTION OF THE PREFERRED EMBODIMENTS

Hereinafter, embodiments of the present invention will be detailed based on the drawings. Note that members having the same function are denoted by the same reference symbol through all the drawings for explaining the embodiments and the repetitive description thereof will be omitted. Additionally, even if being plan views, the drawings for explaining the embodiments are hatched in some cases to easily understand the positional relation among members and their structure.

(First Embodiment)

A semiconductor device according to this first embodiment has a CMISFET (Complementary MISFET). The manufacturing process of a semiconductor device according to the first embodiment will be described with reference to FIGS. 1 to 16.

Figure 1:
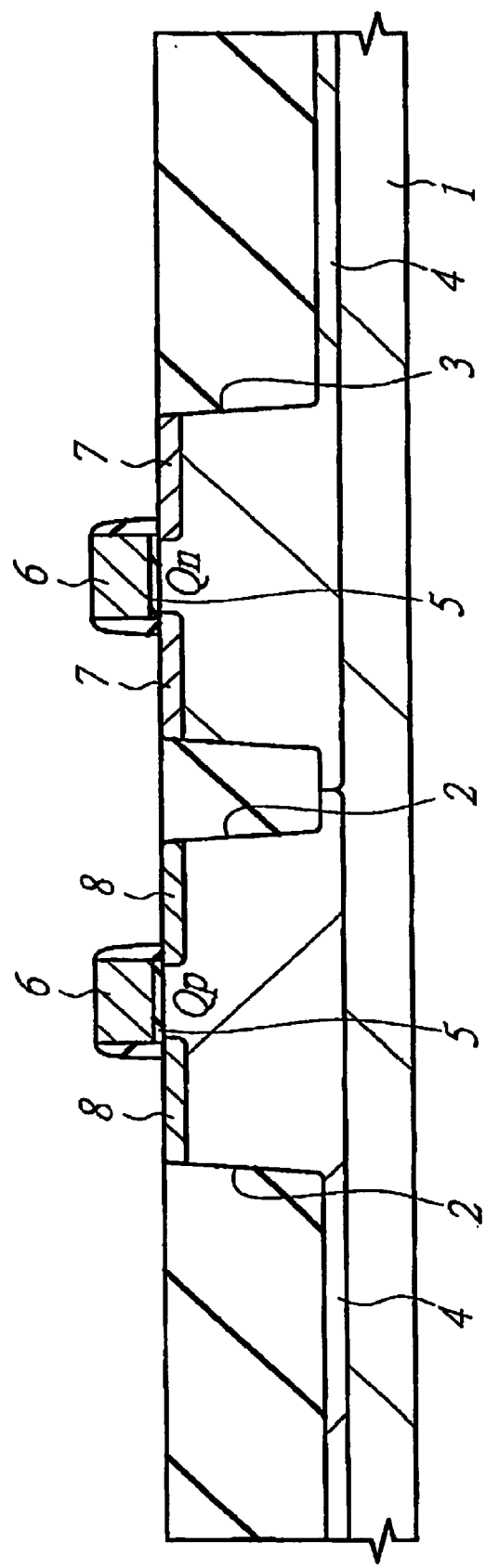
FIG. 1 is a sectional view showing a principal portion for explaining a semiconductor device manufacturing method according to a first embodiment of the present invention.

As shown in FIG. 1, a semiconductor substrate 1 made of monocrystal silicone having a specific resistance of approximately 10 Ωcm is thermally treated at approximately 850° C., and a thin silicone oxide film (pad oxide film) having a thickness of 10 nm is formed on its main surface (device formation surface). Next, a silicone nitride film with a thickness of approximately 120 nm is deposited on this silicone oxide film by a CVD (Chemical Vapor Deposition) method and, thereafter, the silicone nitride film and the silicone oxide film in a device separation region are removed by dry etching using a photoresist film as a mask. The silicone oxide film is formed in order to relax a stress applied to the substrate at the time of densifying the silicone oxide film to be embedded into a device separation groove in a subsequent process. The silicone nitride film has such a property as not to be easily oxidized, and so is used as a mask for preventing the substrate surface in its lower portion (active region) from being oxidized.

Subsequently, a groove with a depth of approximately 350 nm is formed in the semiconductor substrate 1 within the device separation region by dry etching using a silicone nitride film as a mask. Thereafter, to remove a damaged layer generated on a inner wall of the groove by etching, the semiconductor substrate 1 is thermally treated at approximately 1000° C. and a thin silicone oxide film with a thickness of approximately 10 nm is formed on the inner wall of the groove.

Then, after the silicone oxide film is deposited on the semiconductor substrate 1 by the CVD method, the semiconductor substrate 1 is thermally treated and the silicone oxide film is densified in order to improve the quality of the silicone oxide film. Thereafter, the silicone oxide film is polished by a chemical mechanical polishing (CMP) method using a silicone nitride film as a stopper so as to be left within the groove, whereby device separating grooves 2 whose surfaces are planarized are formed.

Next, after the silicone nitride film remaining in the active region of the semiconductor substrate 1 is removed by wet etching using hot phosphoric acid, boron (B) is ion-implanted into a region for forming an n-channel MISFET (Metal Insulator Semiconductor Field Effect Transistor) of the semiconductor substrate 1 to form a p-type well 3. Next, phosphorus (P) is ion-implanted into a region for forming a p-channel MISFET of the semiconductor substrate 1 to form an n-type well 4.

Subsequently, a gate oxide film 5 is formed on each surface of the p-type well 3 and the n-type well 4 by performing a thermal treatment to the semiconductor substrate 1. Then, gate electrodes 6 are formed on a top of the gate oxide film 5. The gate electrode 6 is composed of three conductive films obtained by laminating, for example, a low-resistance polycrystalline silicone film doped with P, a WN (tungsten nitride) film, and a W (tungsten) film in this order.

Next, an n-type semiconductor region (source and drain) 7 is formed by ion-implanting P or As into the p-type well 3, and a p-type semiconductor region (source and drain) 8 is formed by ion-implanting B into the n-type well 4. By the process as described thus far, an n-channel MISFET Qn is formed in the p-type well 3 and a p-channel MISFET Qp is formed in the n-type well 4.

Figure 2:
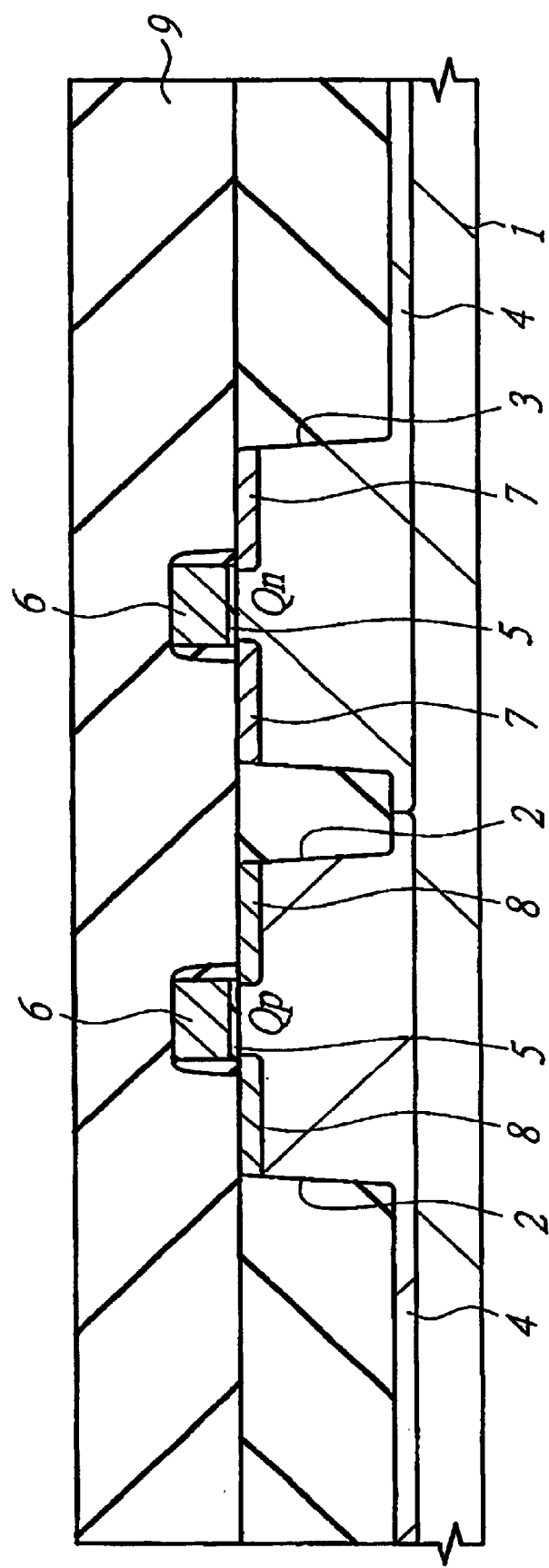
FIG. 2 is a sectional view showing a principal portion of the semiconductor device in the manufacturing process subsequently to FIG. 1.

Next, as shown in FIG. 2, an interlayer insulation film (first insulation film) 9 is formed on the n-channel MISFET Qn and the p-channel MISFET Qp. In the first embodiment, this interlayer insulation film 9 may be, for example, a silicone oxide film deposited by the CVD method.

Figure 3:
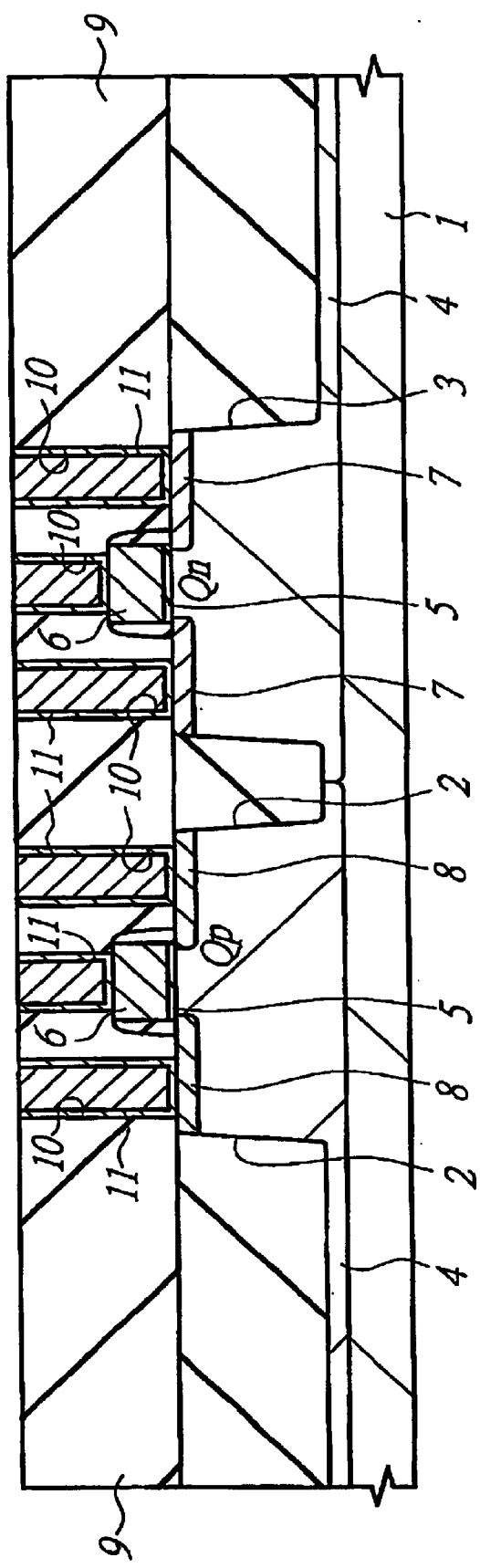
FIG. 3 is a sectional view showing a principal portion of the semiconductor device in the manufacturing process subsequently to FIG. 2.

Next, the interlayer insulation film 9 is dry-etched by using, as a mask, a photoresist film (not shown) patterned through a photolithography technique, as shown in FIG. 3, whereby contact holes 10 are formed on the gate electrode 6, the n-type semiconductor region 7, and the p-type semiconductor region 8. Subsequently, for example, a titanium nitride film is deposited on the semiconductor substrate 1 including each inside of the contact holes 10 by a spattering method. Thereafter, for example, a tungsten W film is further deposited by the CVD method, and the contact holes 10 are filled with that W film. Then, the titanium nitride film and the W film on the interlayer insulation film 9 and except the contact holes 10 are removed by, for example, the CMP method, to form plugs 11.

Figure 4:
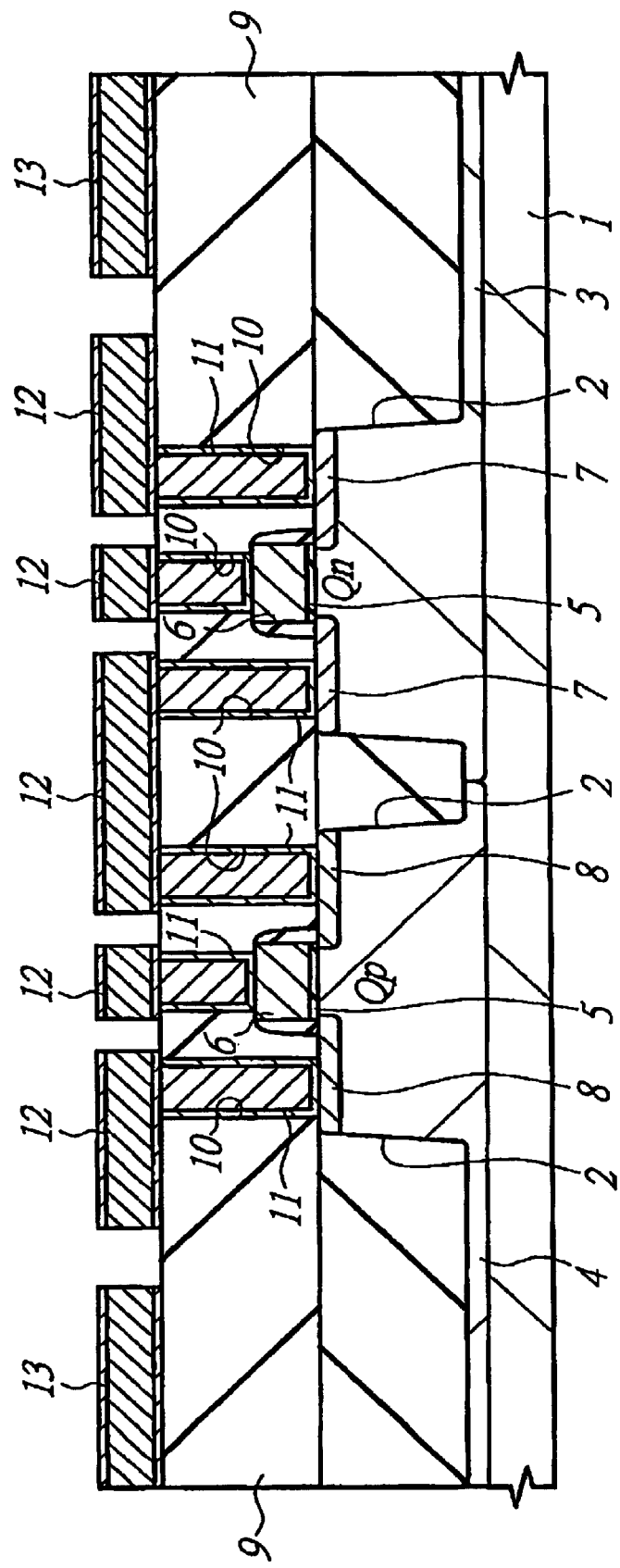
FIG. 4 is a sectional view showing a principal portion of the semiconductor device in the manufacturing process subsequently to FIG. 3.
Figure 5:
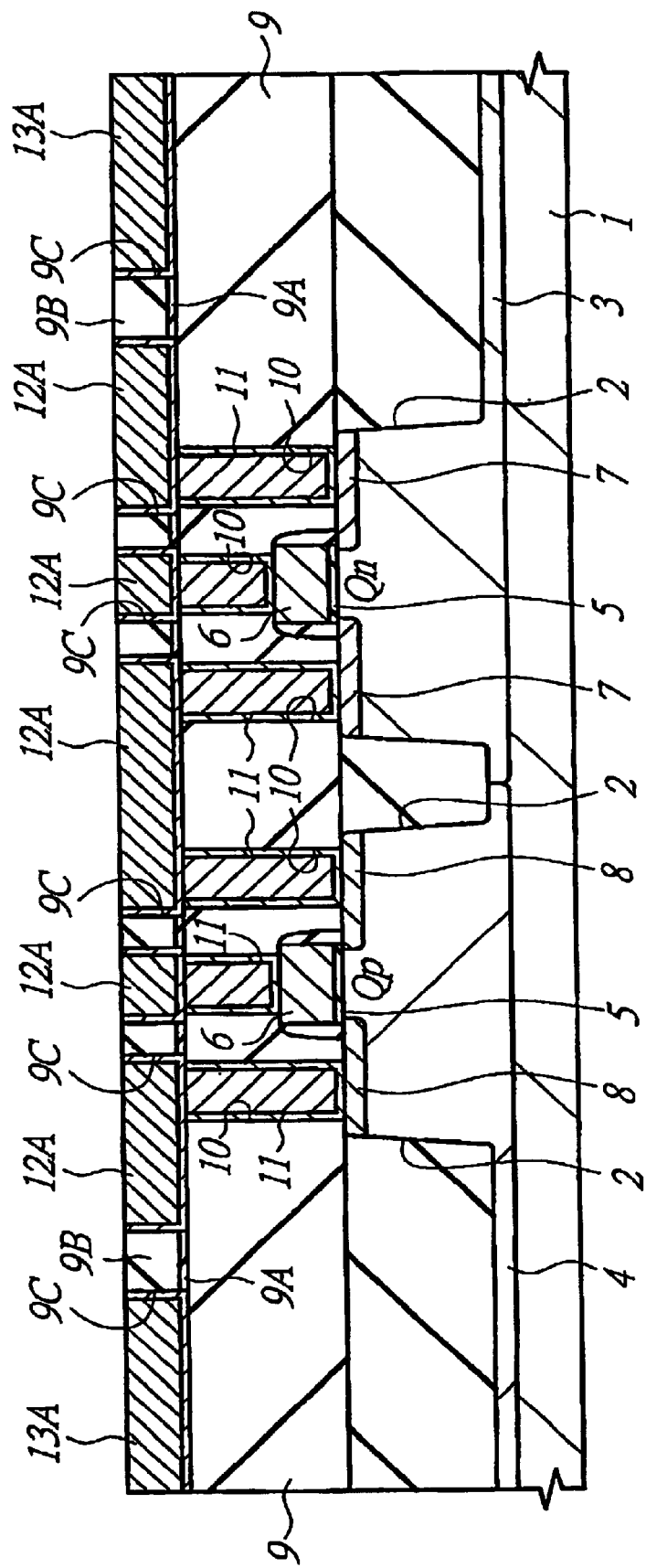
FIG. 5 is a sectional view showing a principal portion of the semiconductor device in the manufacturing process according to the first embodiment of the present invention.

Next, as shown in FIG. 4, a Ti (titan) film, an Al (aluminum) alloy film, and a titan nitride film are deposited sequentially on the interlayer insulation film 9. Then, the Ti film, the Al alloy film, and the titan nitride film are patterned by the dry etching using a photoresist film (not shown) as a mask, whereby wirings 12 and 13 electrically connected to the plugs 11 are formed. These wirings 12 and 13 constitute a first wiring layer. Also, instead of forming the wirings 12 and 13 as shown in FIG. 4, buried wirings may be, for example, formed by: forming wiring grooves for burying wirings in an insulation film deposited on the interlayer insulation film 9; and burying a conductive material in the wiring grooves. To form such buried wirings, first, a silicone nitride film (first insulation film) 9A and a silicone oxide film (first insulation film) 9B are sequentially deposited on the interlayer insulation film 9 by, for example, the CVD method. Next, the silicone nitride film 9A and the silicone oxide film 9B are processed using a photolithography technology and a dry etching technology, and the wiring grooves 9C for burying the wirings is formed. Then, a titanium nitride film is deposited on the silicone oxide film 9B including the insides of the wiring grooves 9C by, for example, the spattering method. Thereafter, a Cu (copper) film for burying the wiring grooves 9C is deposited on the silicone oxide film 9B by a plating method. Then, the excessive titanium nitride film and Cu film on the silicone oxide film 9B are removed by, for example, the CMP method to leave the titan nitride film and the Cu film within the wiring grooves 9C, and the buried wirings 12A and 13A within the wiring grooves 9C are formed. The titanium nitride film can be made to function as a barrier conductive film for preventing diffusion of Cu from the wiring grooves 9C. When the buried wirings 12A and 13A are formed, for example, a W (tungsten) film deposited by the CVD method may be used instead of using the Cu film. Note that, in the first embodiment described later, the following steps will be subsequent to the step described with reference to FIG. 4.

Figure 6:
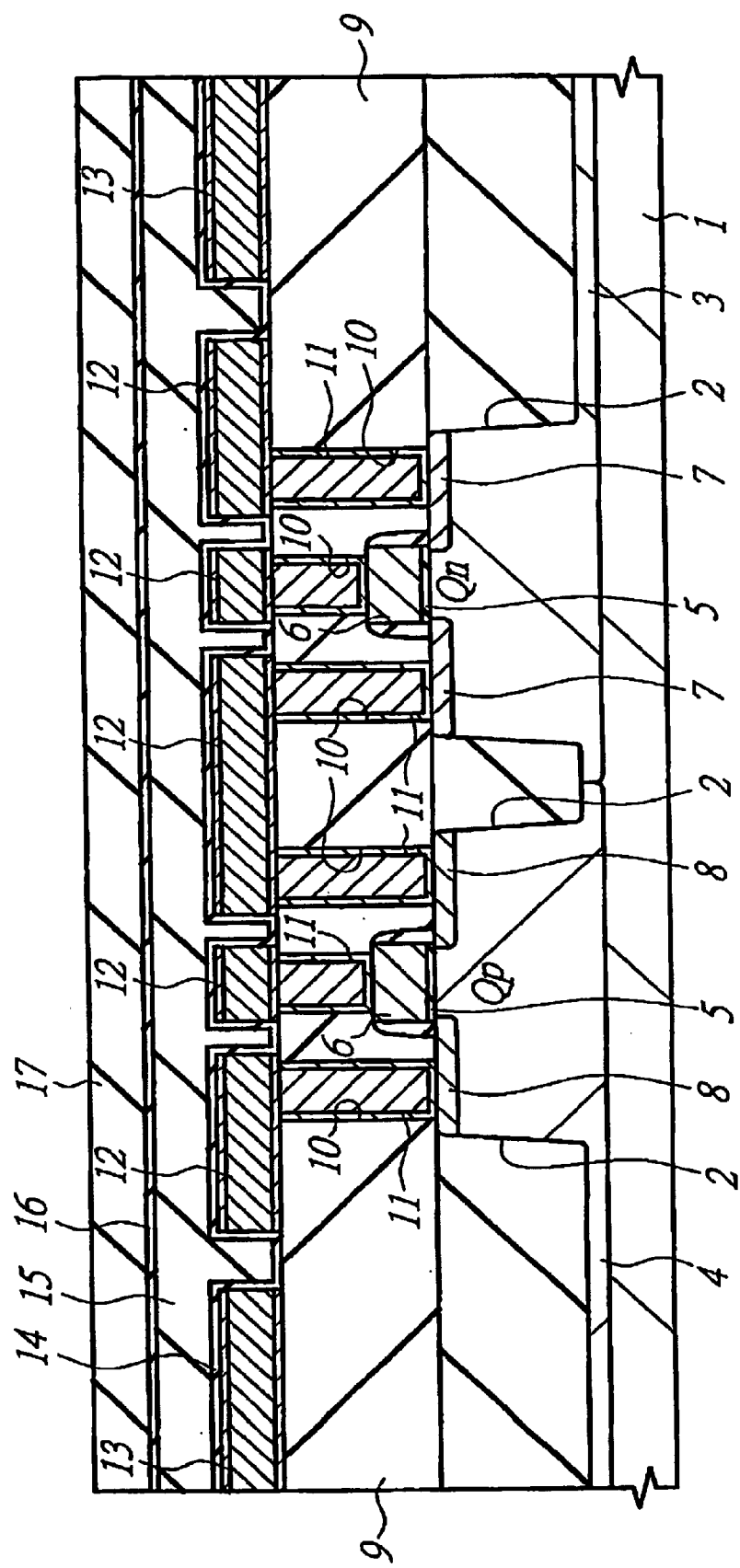
FIG. 6 is a sectional view showing a principal portion of the semiconductor device in the manufacturing process subsequently to FIG. 4.

Next, as shown in FIG. 6, an etch stopper film 14, an interlayer insulation film (second insulation film) 15, an etch stopper film 16, and an interlayer insulation film (second insulation film) 17 are formed sequentially on the semiconductor substrate 1. The etch stopper films 14 and 16 can be formed by depositing a silicone nitride film having a thickness of approximately 50 nm by, for example, the plasma CVD method, and can be made to function as etch stopper films during the etching in a subsequent process. At the time of forming the wiring grooves for burying the wirings, and/or holes in the interlayer insulation film 17, the etch stopper film 16 is one for avoiding damage to lower layers due to excessive digging or deterioration of processing dimensional accuracy. Instead of using silicone nitride films as the etch stopper films 14 and 16, an SiC (silicone carbide) film deposited by a plasma CVD method or a SiCN (silicone carbide nitride) film containing a predetermined amount of N (nitrogen) in components of an SiC (silicone carbide) film may be used. Because the SiC film and the SiCN film are relatively lower in dielectric constant than the silicone nitride film, use of a SiC or SiCN film as each of the etching stopper films 14 and 16 makes it possible to improve wiring delay in the semiconductor device according to this embodiment. As the interlayer insulation films 15 and 17, there is used an insulation film (low-dielectric-constant insulation film) having a thickness of approximately 300 to 400 nm and having a lower specific permittivity than the specific permittivity (approximately 4.1 to 4.2) of a silicone oxide film (e.g., TEOS (tetraethoxysilane) oxide film) formed by, for example, the CVD method. Such a low-dielectric-constant insulation film is, for example, an organic polymer system film, a porous organic polymer system film, a MSQ (methyl silsesquioxane) system film, a porous MSQ (methyl silsesquioxane) system film, a HSQ (hydrogen silsesquioxane) system film, a porous HSQ (hydrogen silsesquioxane) system film, or the like. The use of the above-mentioned low-dielectric-constant insulation film as each of the interlayer insulation films 15 and 17 makes it possible to reduce the total dielectric constant of the wirings in the semiconductor device according to this embodiment, thereby allowing the wiring delay to be improved. Note that, although not shown, a silicone oxide film (TEOS oxide film) with a thickness of approximately 100 nm is deposited on the surface of the interlayer insulation film 17 by, for example, the plasma CVD method using a TEOS gas. Since the above-mentioned low-dielectric-constant insulation film are lower in mechanical strength than the TEOS oxide film, the mechanical strength of the interlayer insulation film 17 can be reinforced by forming such a TEOS oxide film.

Figure 7:
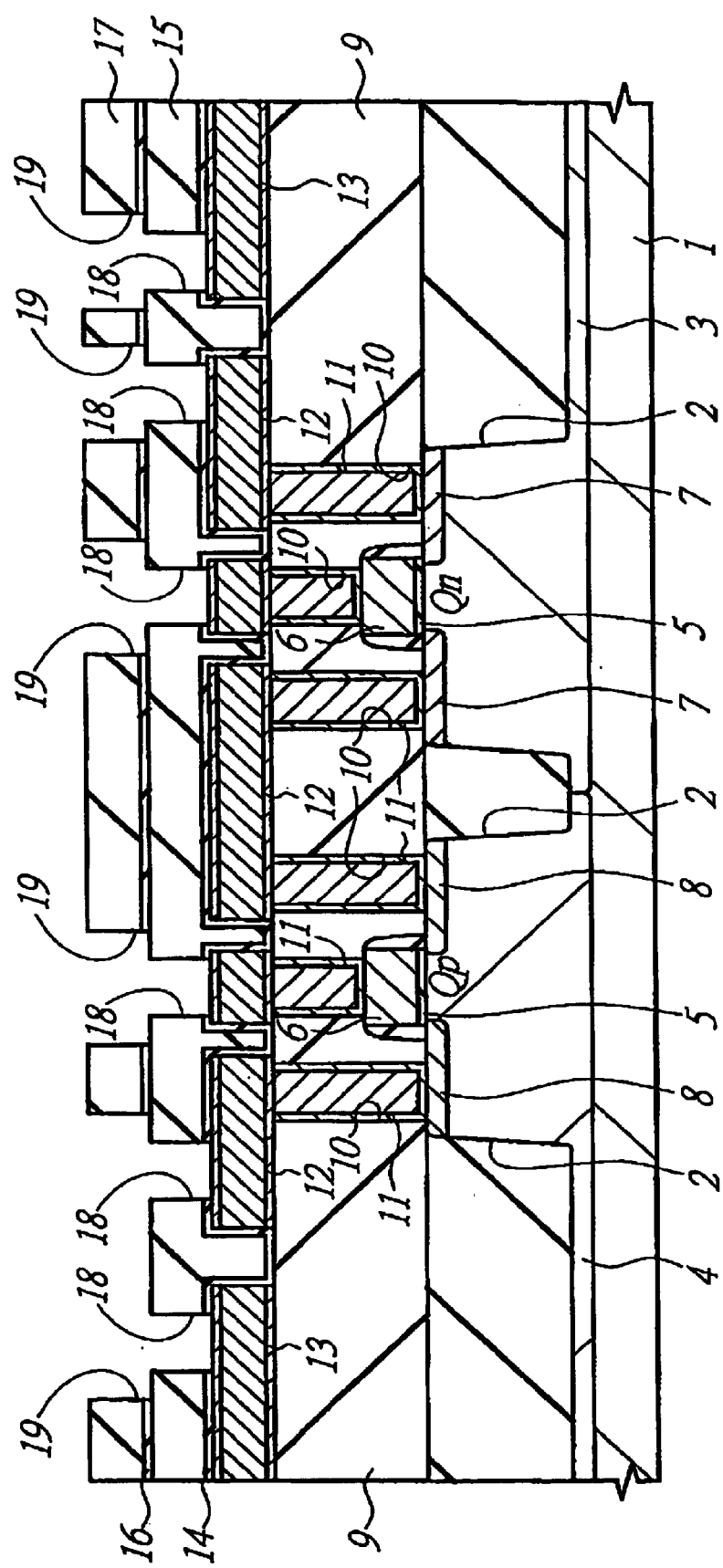
FIG. 7 is a sectional view showing a principal portion of the semiconductor device in the manufacturing process subsequently to FIG. 6.

Next, as shown in FIG. 7, there are formed connecting holes 18 for connecting: the wirings 12 and 13 serving as underlying wirings; and an upper layer wiring formed in a subsequent process. This connecting hole 18 can be formed by: forming, by a photolithography process, a photoresist film having the same shape as that of a connecting pattern for connecting the wirings 12 and 13 on the interlayer insulation film 17; and dry etching with using it as a mask. Then, the photoresist film having been used for forming the connecting holes 18 is removed, and a photoresist film having the same shape as that of a wiring groove pattern is newly formed on the interlayer insulation film 17 by the photolithography process. Next, by dry etching with using it as a mask, the wiring grooves 19 can be formed.

Figure 8:
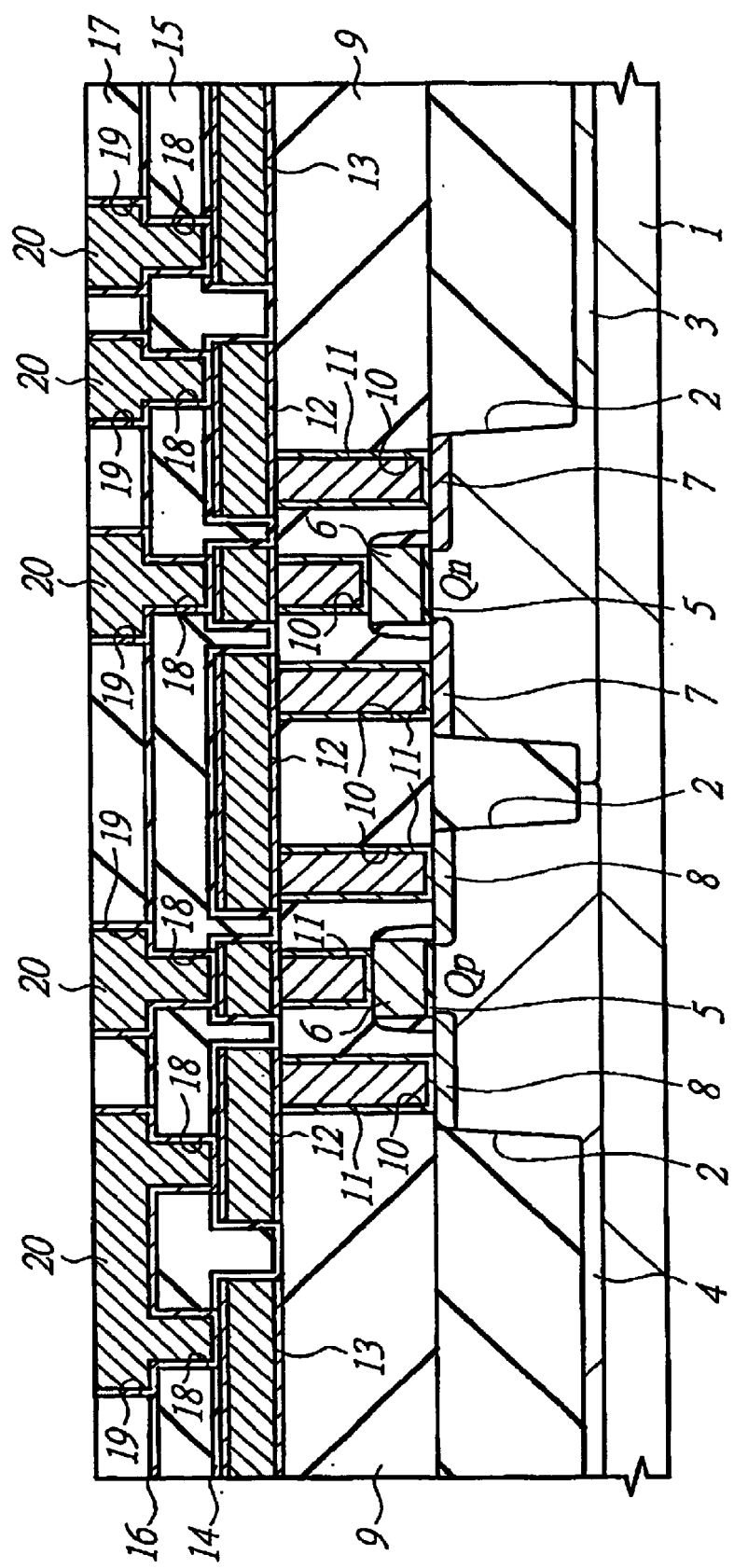
FIG. 8 is a sectional view showing a principal portion of the semiconductor device in the manufacturing process subsequently to FIG. 7.

Next, as shown in FIG. 8, by depositing a tantalum nitride film on the interlayer insulation film 17 including the insides of the connecting holes 18 and the wiring grooves 19 by, for example, a reactive spattering method, a barrier conductive film is formed. The deposition of this tantalum nitride film is made in order to improve adhesion properties of a Cu film deposited in a subsequent process and prevent diffusion of Cu, and the thickness thereof is approximately 30 nm, for example. Note that although the tantalum nitride is exemplified as a barrier conductive film in the first embodiment, there may be used a metallic film made of tantalum or the like, a laminated film made of tantalum nitride and tantalum, a laminated film of a titan nitride or metallic film and a titan nitride, or the like.

Subsequently, for example, a Cu or Cu alloy film to be a seed film is deposited on the interlayer insulation film 17 on which the barrier conductive film is deposited. If this seed film is a Cu alloy film, Cu contained in the alloy is approximately 80 weight percent or more. The seed film is deposited by an ionization spattering method, which enhances directivity of the spattering by ionizing copper spattering atoms, and its thickness is set to approximately 100 to 200 nm on the surface of the barrier conductive film except the insides of the wiring grooves 14, preferably to approximately 150 nm.

Subsequently, a Cu film is deposited on the interlayer insulation film 17, on which the seed film is deposited, so that the connecting holes 18 and the wiring grooves 19 are filled therewith. The copper film with which the connecting holes 18 and the wiring grooves 19 are filled is formed by, for example, an electrolytic plating method, and, for example, its plating solution may be one obtained by adding, to $H_2SO_4$ (sulfuric acid), 10% $CuSo_4$ (copper sulfate) and additive for improving a coverage of the copper film.

Then, the high-quality Cu film can be obtained by relaxing distortion of the Cu film through annealing.

Subsequently, the excessive barrier conductive film, seed film, and Cu film on the interlayer insulation film 17 are removed, and the barrier conductive film, seed film, and Cu film are left in the connecting holes 18 and the wiring grooves 19 to form the buried wirings 20. The removal of the barrier conductive film, the seed film, and the Cu film is carried out by polishing with the CMP method. Such buried wirings 20 constitute a second wiring layer.

After the above-mentioned buried wirings 20 are formed, polishing grains and copper adhering to the surface of the semiconductor substrate 1 are removed by a two-stage brush scrubbing method using 0.1% ammonia water and purified water.

Figure 9:
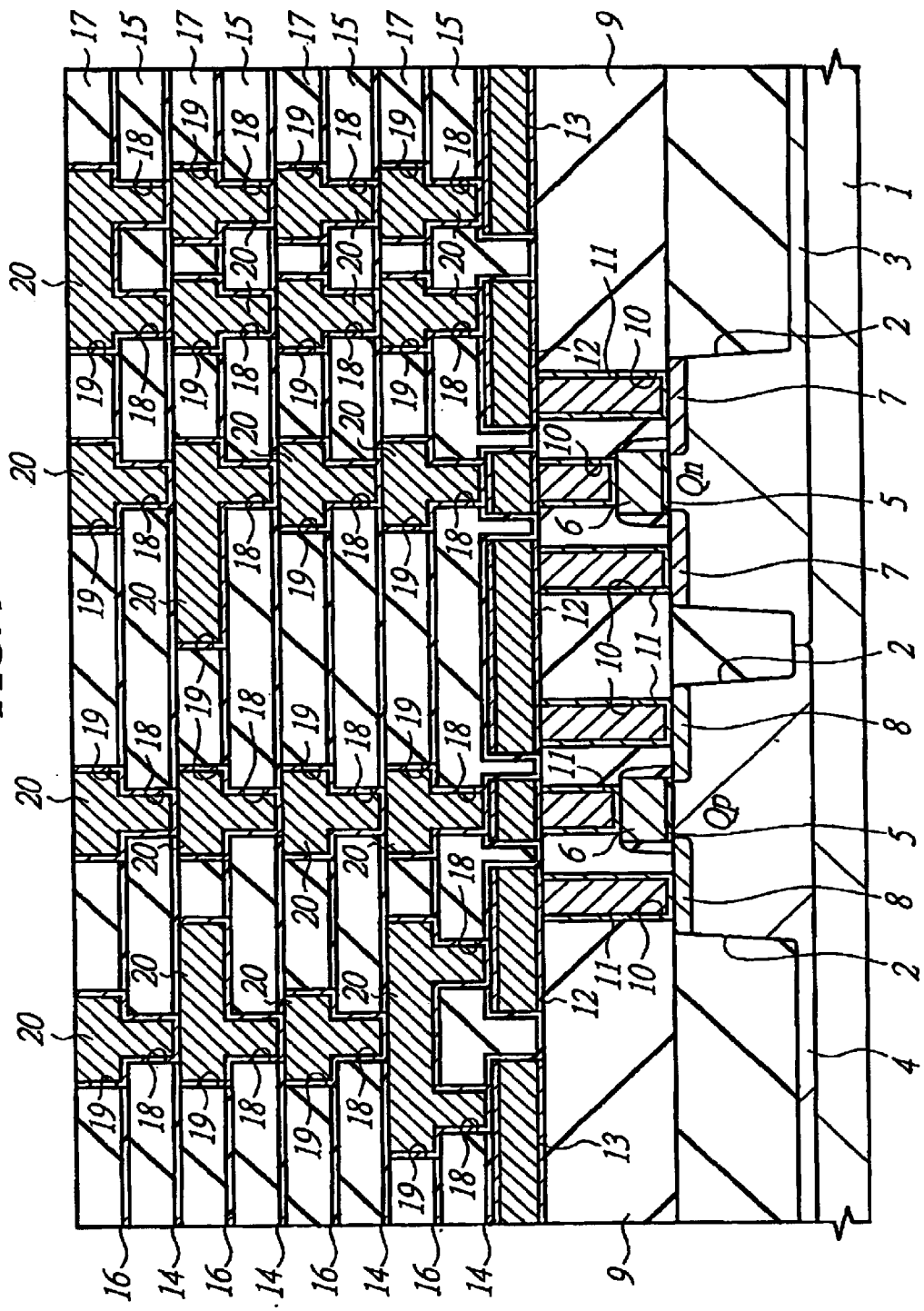
FIG. 9 is a sectional view showing a principal portion of the semiconductor device in the manufacturing process subsequently to FIG. 8.

Thereafter, as shown in FIG. 9, the connecting holes 18 and the wiring grooves 19 are formed in the above-mentioned etch stopper film 14, interlayer insulation film 15, etch stopper film 16, and interlayer insulation film 17, and the same process as the process for forming the buried wirings 20 in the connecting holes 18 and the wiring grooves 19 may be repeated so as to form the buried wirings in many layers (wiring layers). These buried wirings 20 are patterned so as not to be disposed outside the underlying wiring layer 13 in a plane when the semiconductor substrate 1 is cut out to individual semiconductor chips in a subsequent process.

Figure 10:
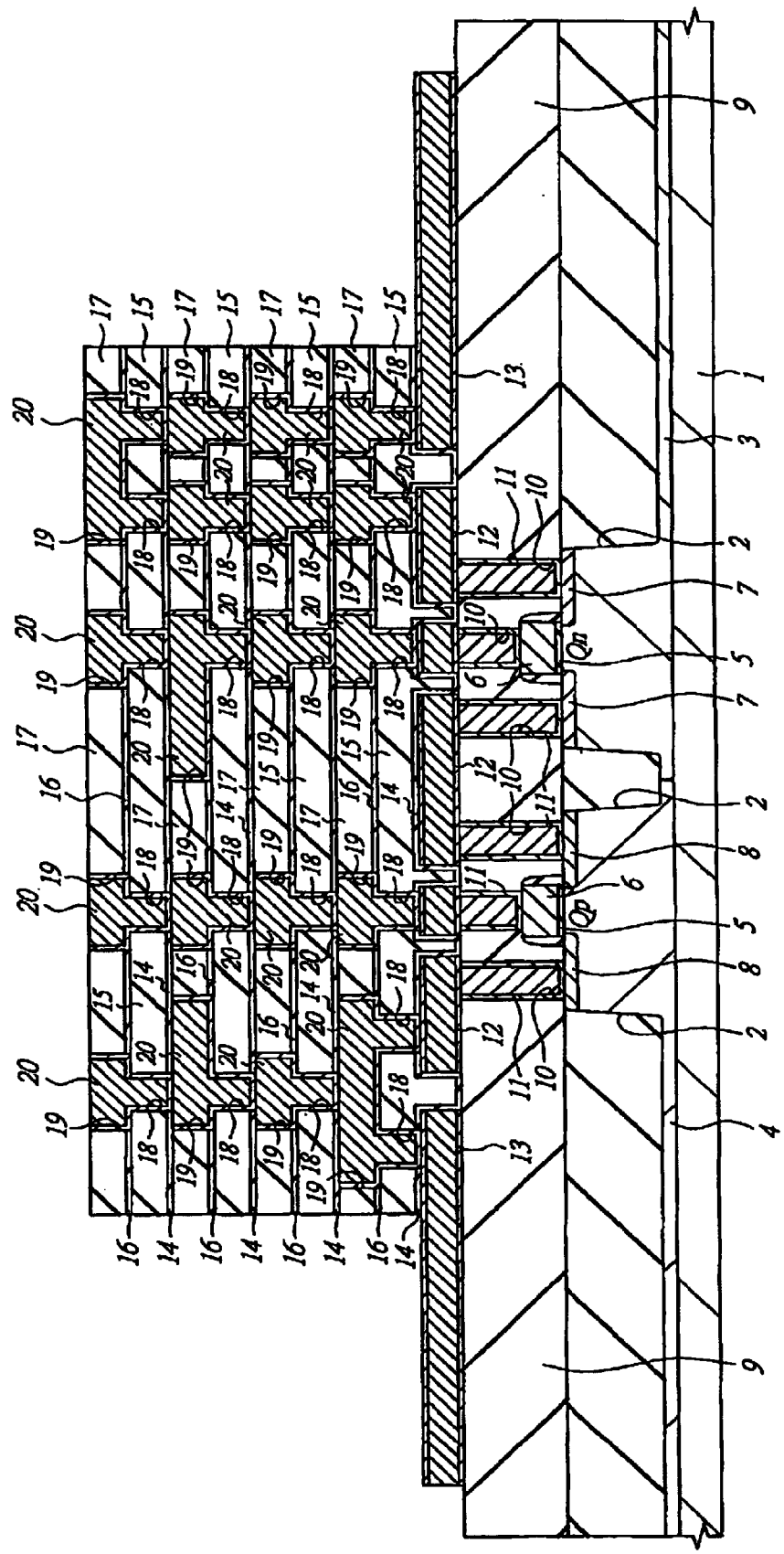
FIG. 10 is a sectional view showing a principal portion of the semiconductor device in the manufacturing process subsequently to FIG. 9.

Next, as shown in FIG. 10, the interlayer insulation films 17 and 15 and the etch stopper films 16 and 14 are patterned by the dry etching using, as a mask, a photoresist film (not shown) patterned by a photolithography technology, whereby each part of the wirings 13 is exposed.

Figure 11:
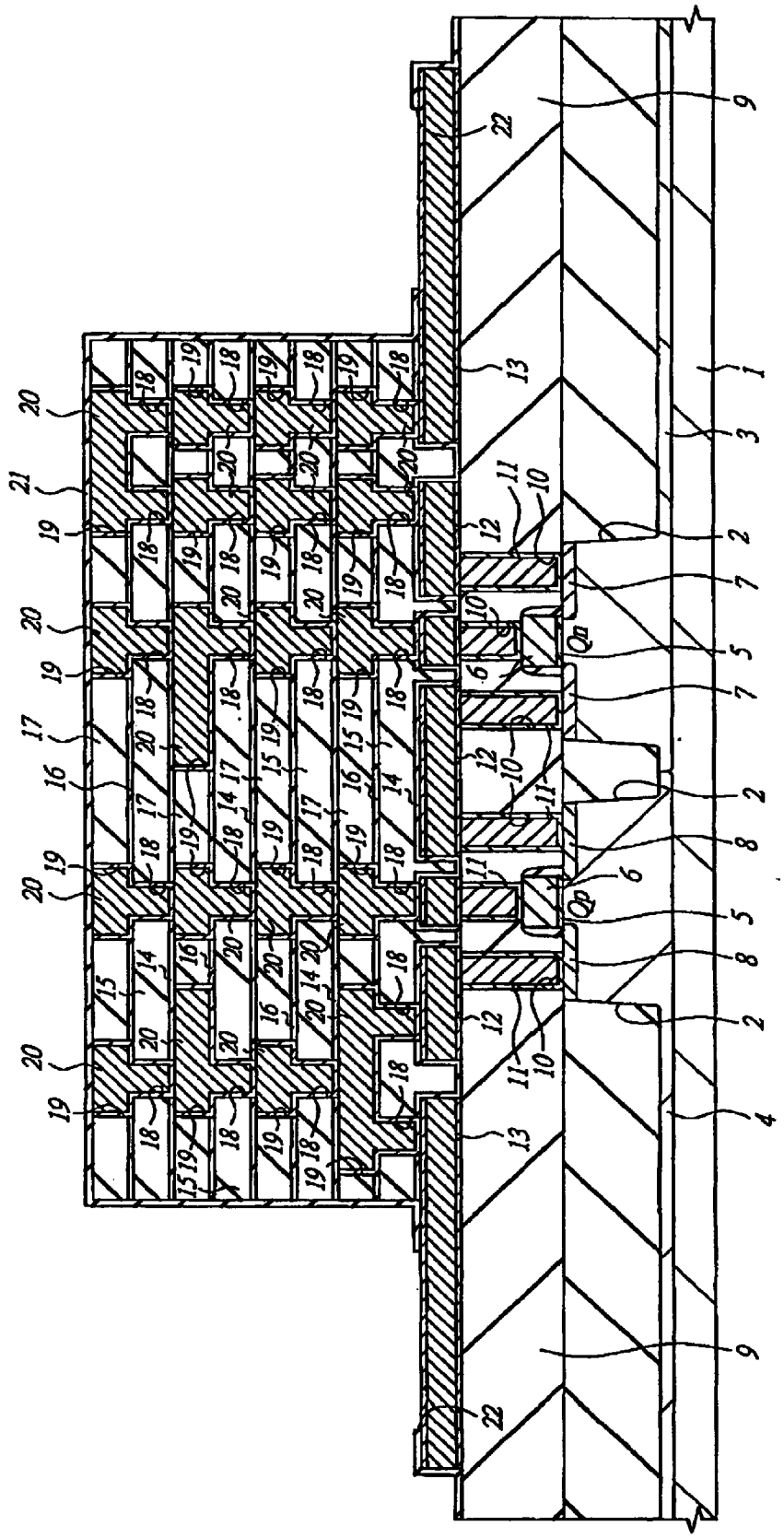
FIG. 11 is a sectional view showing a principal portion of the semiconductor device in the manufacturing process subsequently to FIG. 10.

Next, as shown in FIG. 11, a surface protective film 21 is formed by depositing a silicone nitride film over the semiconductor substrate 1 with, for example, the CVD method. Subsequently, the silicone nitride film on the wirings 13 is dry etched using, as a mask, a photoresist film (not shown) patterned by, for example, the photolithography technology, and openings 22 reaching the wirings 13 are formed in the silicone nitride film. Consequently, the wirings 13 can be used as bonding pads.

Figure 12:
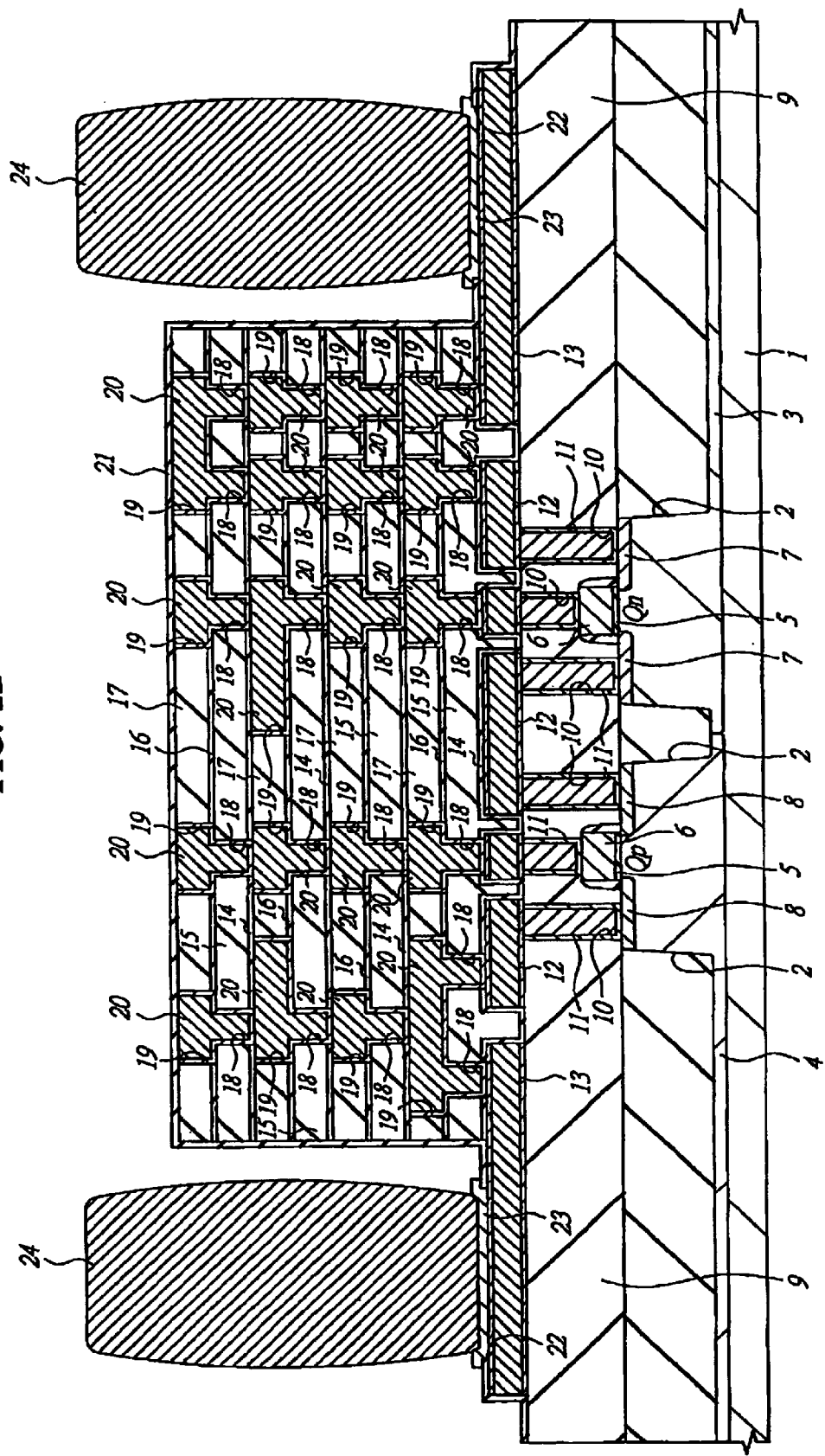
FIG. 12 is a sectional view showing a principal portion of the semiconductor device in the manufacturing process subsequently to FIG. 11.

Next, as shown in FIG. 12, a Ti film and a W film are deposited in this order over the semiconductor film 1 by, for example, the spattering method, and metallic films 23 connected electrically to the wirings 13 through the openings 22 are formed. Then, the metallic films 23 are patterned by dry etching using, as a mask, a photoresist film (not shown) patterned by the photolithography technology, and the metallic films 23 electrically connected to the wirings 13 through the openings 22 are left and the other metallic films 23 not connected thereto are removed. After removing the photoresist film used for the patterning of the metallic films 23, an Au (gold) film is formed on the remaining metallic films 23 by the plating method and by using a photoresist film (not shown) patterned newly by the photolithography technology. Consequently, a bump electrode 24 is formed of an Au (gold) film. At this time, the bump electrode 24 is formed so that its height becomes larger than that of a position where the uppermost wiring layer (buried wiring 20 (including the surface protective film 21 on the uppermost buried wiring 20) is formed.

Figure 13:
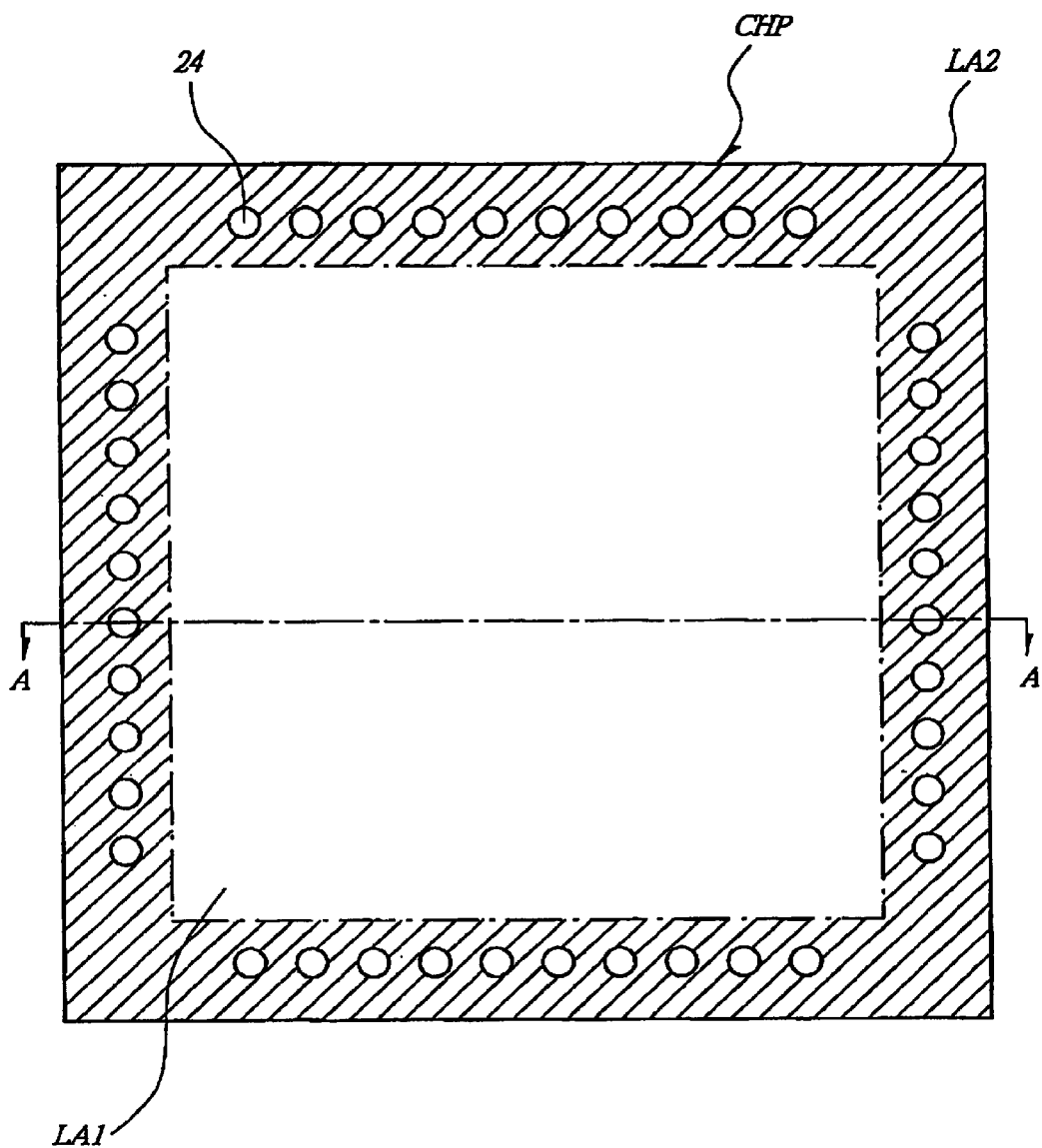
FIG. 13 is a plan view showing a principal portion of the semiconductor device in the manufacturing process according to the first embodiment of the present invention.

Next, a rear surface of the semiconductor substrate 1 is polished by a gliding method to thin the semiconductor substrate 1 up to a predetermined amount. Then, the semiconductor substrate 1 is cut along its division regions to divide individual semiconductor chips. At this time, as shown in FIG. 13, the bump electrodes 24 are arranged in a region (first region) LA2 surrounding a region LA1 where the second or higher wiring layer (buried wiring 20) is formed on a plane of a semiconductor chip CHP. Note that FIG. 12 corresponds to a sectional view taken along the line A—A in FIG. 13.

Meanwhile, if the bonding pad is formed using the uppermost wiring layer, impact generated at the time of the bonding is transmitted to the interlayer insulation films 15 and 17 and the wiring layer (buried wiring 20), regardless of the bonding using the bump electrode formed on the bonding pad or the bonding using the bonding wires. The above-mentioned low-dielectric-constant insulation film used as each of the interlayer insulation films 15 and 17 is lower in mechanical strength than the silicone oxide film deposited by the CVD method and used as the interlayer insulation film 9. Consequently, a strong pulling force is exerted on the interlayer insulation films 15 and 17 and the wiring layers, whereby there arises the problem such as disconnection of the buried wirings 20, separation between the buried wirings 20 and the interlayer insulation films 15 and 17, and separation between the interlayer insulation films 15 and 17. Meanwhile, in the semiconductor chip CHP of the first embodiment, the interlayer insulation film 9 formed of a silicone oxide film formed by the CVD method is formed under the wiring 13 serving as the bonding pad, but no low-dielectric-constant insulation film is formed. Further, the bump electrode 24 is formed so that its height becomes larger than the height of the position where the uppermost wiring layer is formed. Thus, at the time of bonding the semiconductor chip CHP using the bump electrode 24, since impacts transmitted to the interlayer insulation films 15 and 17, which are the low-dielectric-constant insulation films, can be relaxed, the above-mentioned problem can be prevented.

Further, according to the semiconductor chip CHP of the first embodiment, because a first layer of wiring 13 serves as a bonding pad and the bump electrode 24 is formed on the bonding pad, the height of the semiconductor chip CHP can be decreased as compared to the case where the bonding pad is formed using the uppermost wiring layer (regardless of the bonding using the bump electrode formed on the bonding pad or the bonding using the bonding wires). Consequently, by mounting the semiconductor chips CHP of the first embodiment on a product requested to be thin in width, such as a notebook type personal computer, this request can be satisfied.

If the bonding pad is formed using the uppermost wiring layer, the polishing amount of the rear surface of the semiconductor substrate 1 is increased to make low the height of the semiconductor chip. Therefore, there is fear that a reduction in a mechanical strength of the semiconductor chip (semiconductor substrate 1). Meanwhile, because the semiconductor chip CHP of the first embodiment can make low the height of the semiconductor chip CHP without increasing the polishing amount of the rear surface of the semiconductor substrate 1, the mechanical strength of the semiconductor chip CHP (semiconductor substrate 1) can be maintained.

In the first embodiment, the case where the bonding pad is formed using the first wiring layer 13 has been described. However, if a low-dielectric-constant insulation film is not formed on the lower layer, the bonding pad may be formed on the second or higher wiring layer.

Figure 14:
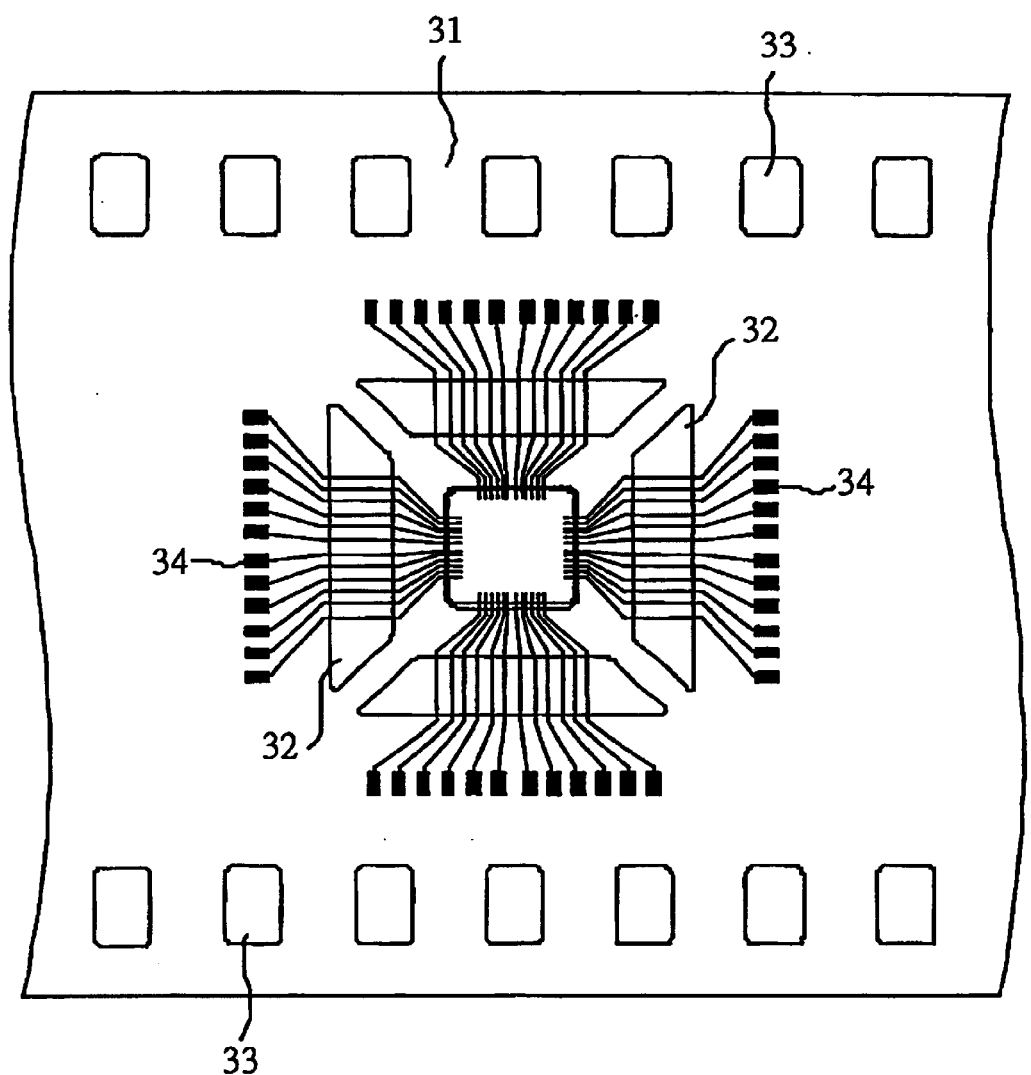
FIG. 14 is a plan view showing a principal portion of an insulation tape used for a packaging step in the semiconductor device manufacturing process according to the first embodiment of the present invention.
Figure 15:
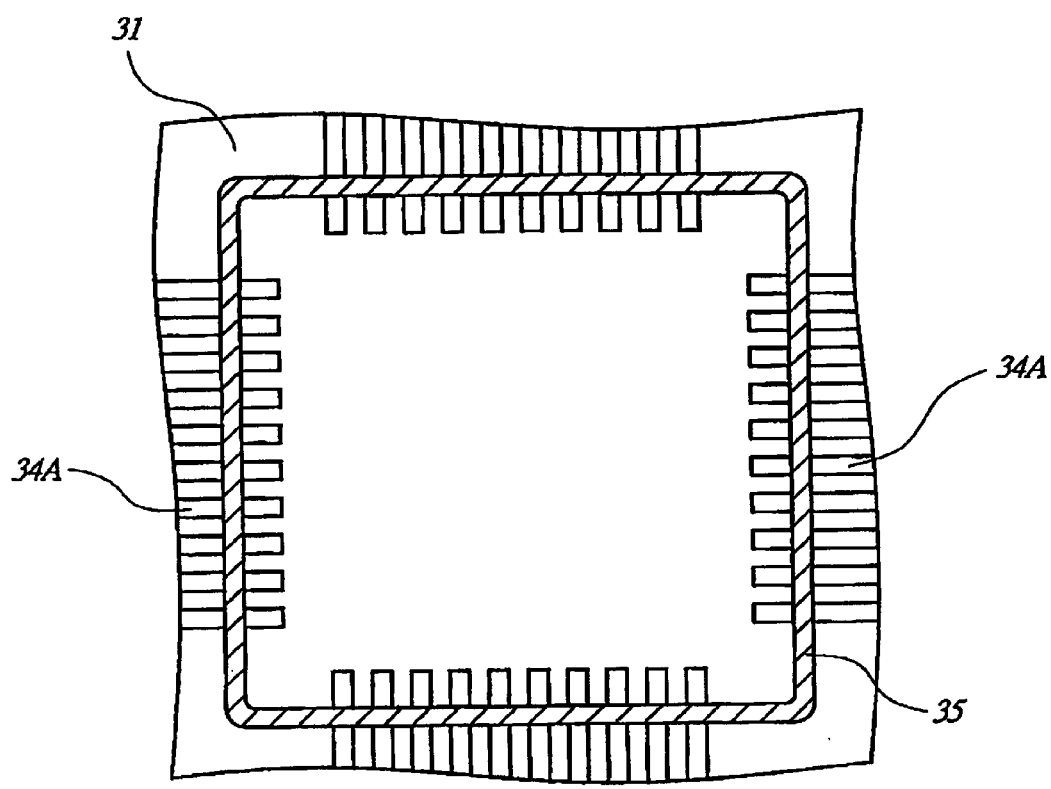
FIG. 15 is an enlarged plan view showing a principal portion of a region where semiconductor chips in the insulation tape as shown in FIG. 14 are bonded

The above-mentioned semiconductor chip CHP may be packaged as, for example, a tape carrier package (hereinafter abbreviated as "TCP"). FIG. 14 is a plan view showing a principal portion of an insulation tape used for packaging a semiconductor CHP, and FIG. 15 is an enlarged plan view showing a principal portion of a region where the semiconductor chip CHP is to be bonded on the insulation tape.

The insulation tape (insulation substrate) 31 is a long tape having a length of approximately several tens m and formed of, for example, a polyimide resin, wherein outer lead holes 32 and sprocket holes 33 are formed. Each of leads 34 disposed on the insulation tape 31 comprises an inner lead 34A connected to the bump electrode 24, and an outer lead positioned on the outer lead hole 32. The lead 34 is made of Cu foil. A surface of the inner lead 34A is plated with, for example, Au/Ni (nickel), Sn (Tin), solder, or the like. A surface of the outer lead to be an external connecting terminal of the TCP is also plated with Au/Ni, Sn, solder or the like. A resin member (first means) 35 having, for example, the same quality as that of the insulation tape 31 is formed on the insulation tape 31. After the semiconductor chip CHP is bonded to the insulation chip 31, this resin member 35 is disposed in a region surrounding the outer periphery of the bump electrode 24 and, after bonding the semiconductor chip CHP, is formed at such a height as to contact with the surface protective film 21 (see FIG. 12) on the outer periphery of the bump electrode 24. By connecting the bump electrodes 24 to the inner leads 34A, the semiconductor chip CHP is bonded to the insulation tape 31. Then, after the semiconductor chip CHP is sealed, the leads 34 (outer leads) are cut out on each outer lead hole 32 so as to form the TCP. Note that the sprocket holes 33 are used for reeling the insulation tape 31.

Figure 16:
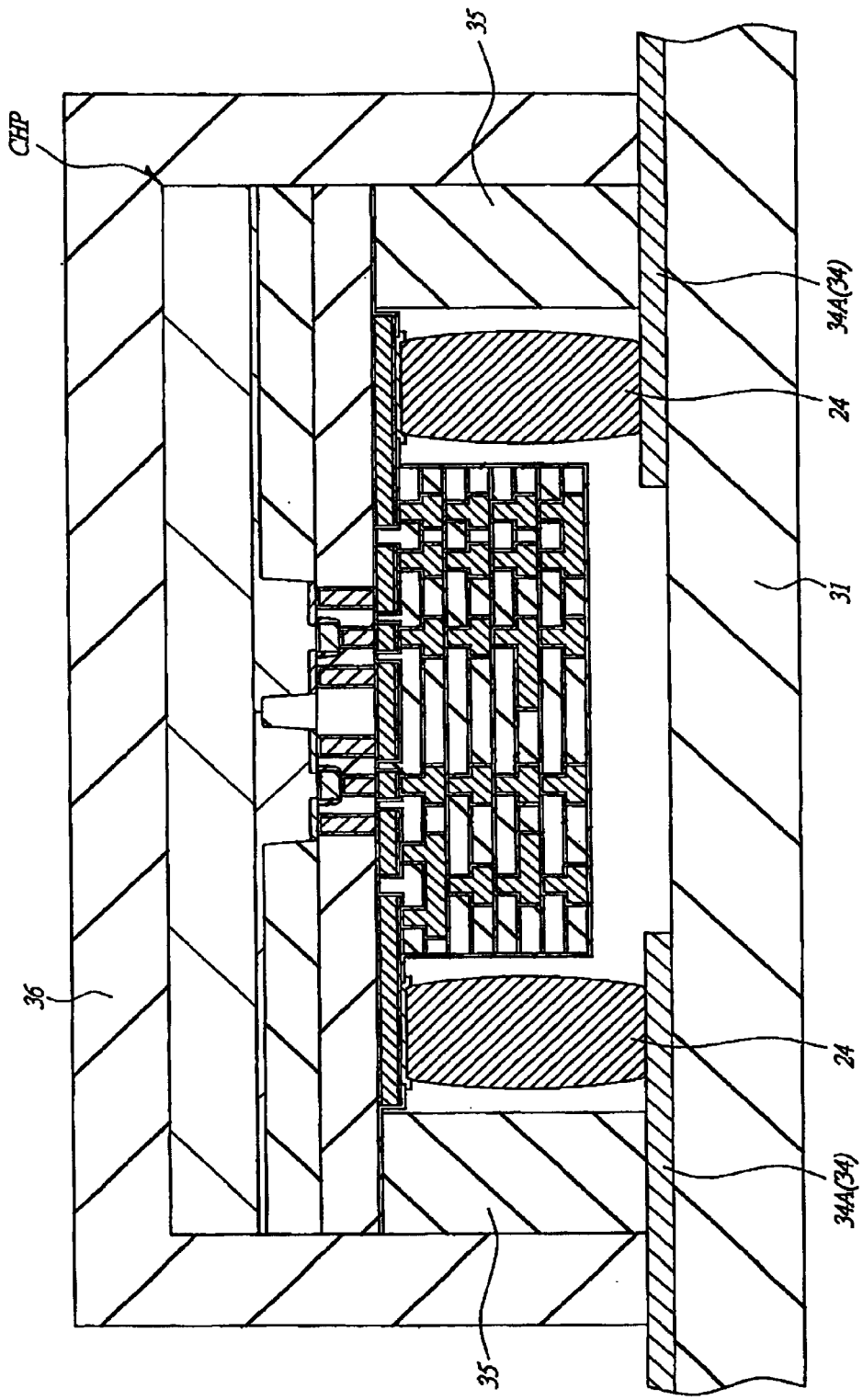
FIG. 16 is sectional view showing a principal portion of the semiconductor device in the manufacturing process according to the first embodiment of the present invention.

After the semiconductor substrate 1 is divided into the individual semiconductor chips CHP, as shown in FIG. 16, the semiconductor chips CHP are arranged so that each of the bump electrodes 24 is connected electrically to the corresponding inner lead 34A. Subsequently, by thermally clamping the individual bump electrodes 24 to the corresponding inner leads 34A, the semiconductor chip CHP is bonded to the insulation tape 31. At this time, the resin member 35 disposed on the insulation tape 31 contacts with the surface protective film 21 (see FIG. 12) on the outer periphery of the bump electrode 24.

Next, the rear and side surfaces of the semiconductor chip CHP are sealed with a resin 36. At this time, the resin member 35 is capable of blocking the resin 36 from flowing into a side of the main surface of the semiconductor chip CHP. The resin 36 contracts if cooled (solidified). Therefore, when the resin flows into the main surface side of the semiconductor chip CHP, a stress from the resin 36 acts on the interlayer insulation films 15 and 17 (see FIG. 12) and the wiring layers (buried wirings 20 (see FIG. 12) due to cooling. Due to application of such a stress, there is fear that there occurs the problem such as the disconnection of the buried wirings 20 including stress migration, the separation between the buried wirings 20 and the interlayer insulation films 15 and 17, the separation between the interlayer insulation films 15 and 17. Thus, as described in the first embodiment, since the resin member 35 prevents the resin 36 from flowing into the main surface side of the semiconductor chip CHP, such a problem can be prevented from occurring.

Figure 17:
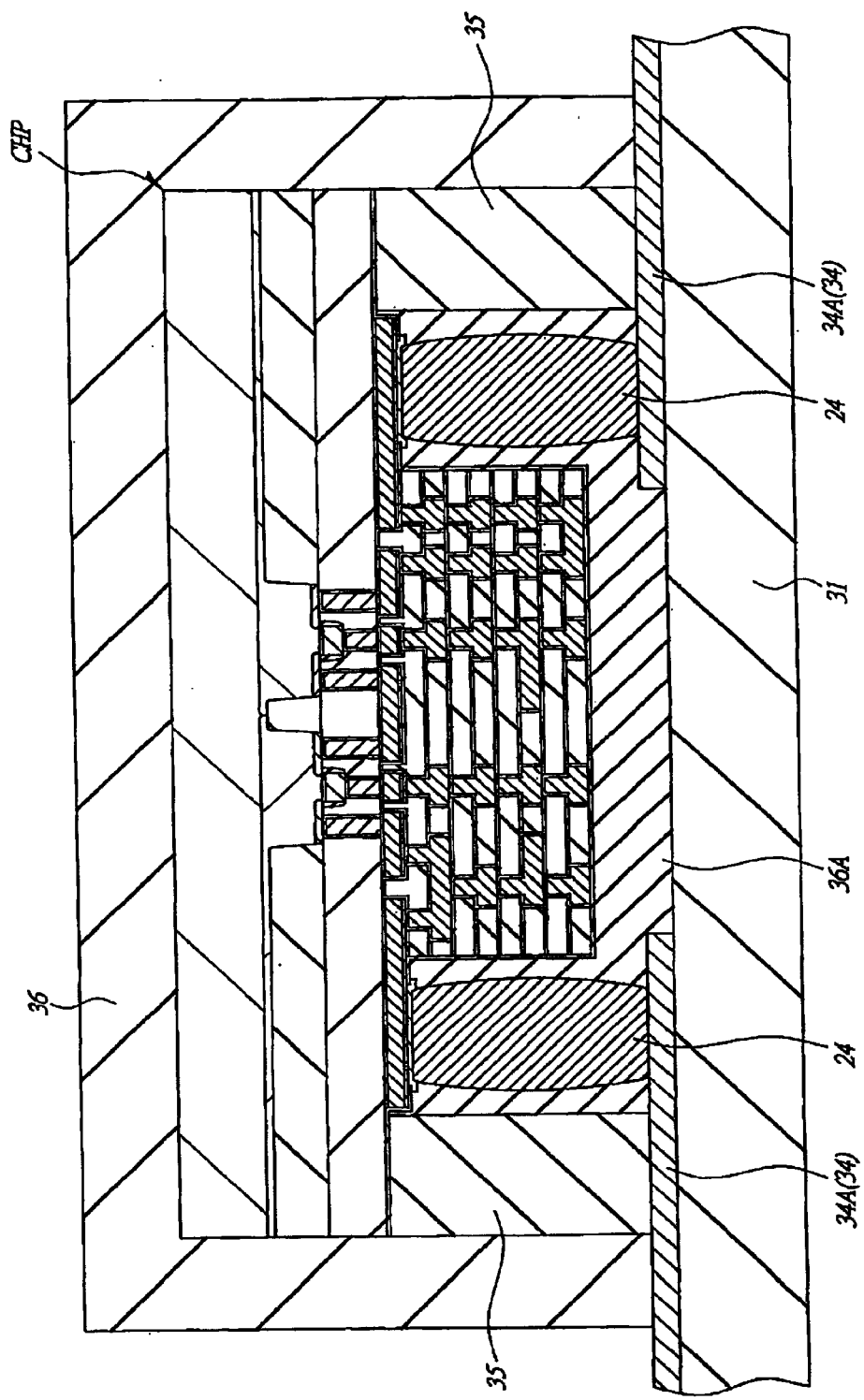
FIG. 17 is sectional view showing a principal portion of the semiconductor device in the manufacturing process according to the first embodiment of the present invention.

Further, as shown in FIG. 17, before bonding the semiconductor chip CHP to the insulation tape 31, a low stress resin 36A lower in post-solidification stress than the resin 36 is preliminarily coated within a region where the semiconductor chip CHP on the insulation tape 31 is disposed. Therefore, by bonding the semiconductor chip CHP to the insulation tape 31, the low stress resin 36A may be filled between the insulation tape 31 and the semiconductor chip CHP. Consequently, while the stress exerted on the interlayer insulation films 15 and 17 and the wiring layers (buried wirings 20) is relaxed, it is possible to prevent an aggregation of moisture from entering through an interface between the resin 36 and the lead 34.

Thereafter, the semiconductor device according to the first embodiment is manufactured by cutting out the leads 34 (outer leads (see FIG. 14)) on the outer lead holes 32 (see FIG. 14).

(Second Embodiment)

Figure 18:
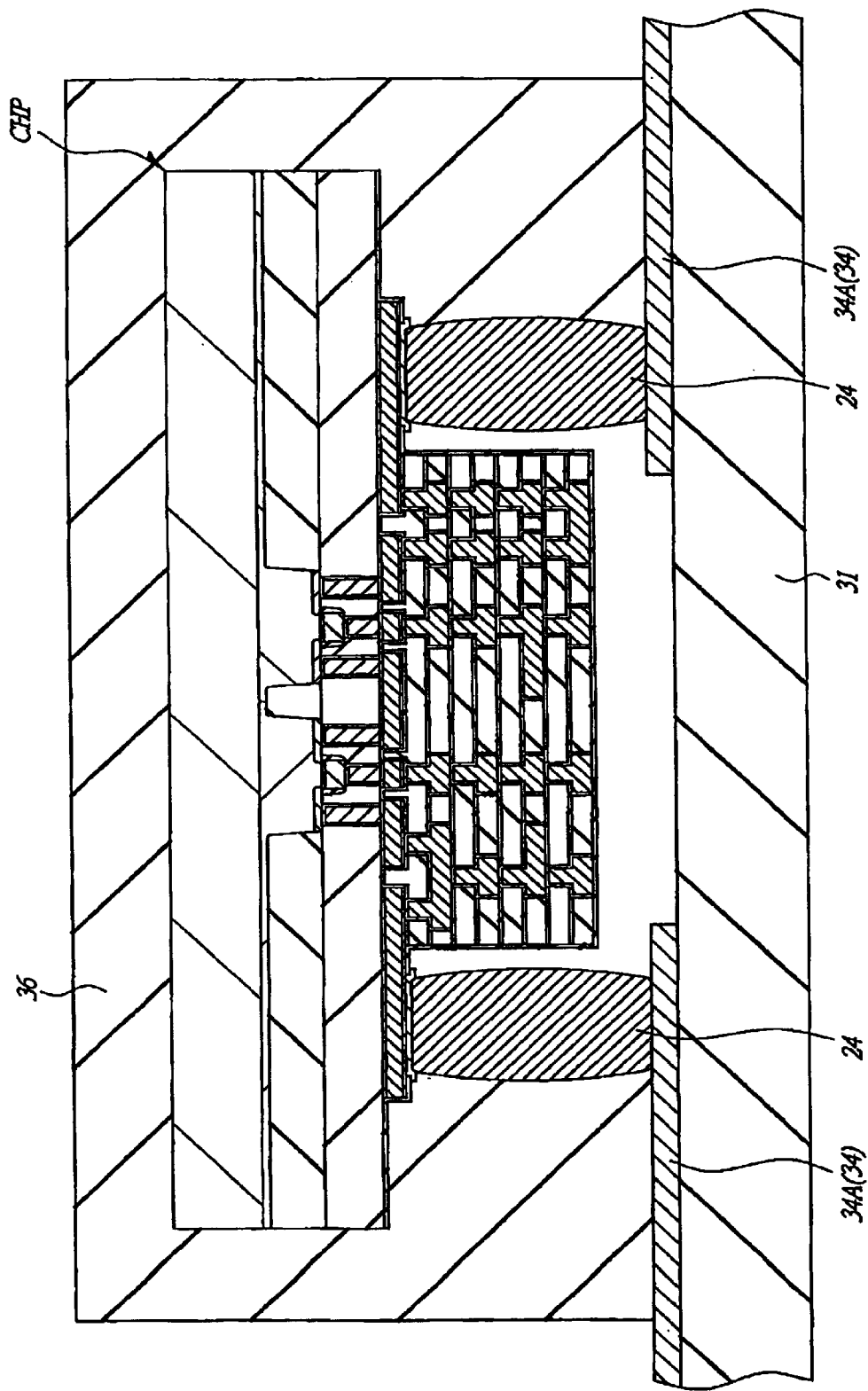
FIG. 18 is sectional view showing a principal portion of a semiconductor device in a manufacturing process according to a second embodiment of the present invention.

FIG. 18 is a sectional view showing a principal portion of a semiconductor device in a manufacturing process according to a second embodiment. In a second embodiment as shown in FIG. 18, the semiconductor chip CHP is packaged using the insulation tape 31 from which the resin member 35 (see FIGS. 15 to 17) described in the first embodiment is omitted. The resin 36 sealing the rear and side surfaces of the semiconductor chip CHP has viscosity in an non-solidified condition, and so if a plurality of bump electrodes 24 adjacent thereto are formed at an interval smaller than a predetermined one, the resin 36 cannot flow into the main surface side of the semiconductor chip CHP through a gap between the adjacent bump electrodes 24. That is, it is possible to provide the bump electrodes 24 with the same function as that of the resin member 35 shown in FIG. 1.

Figure 19:
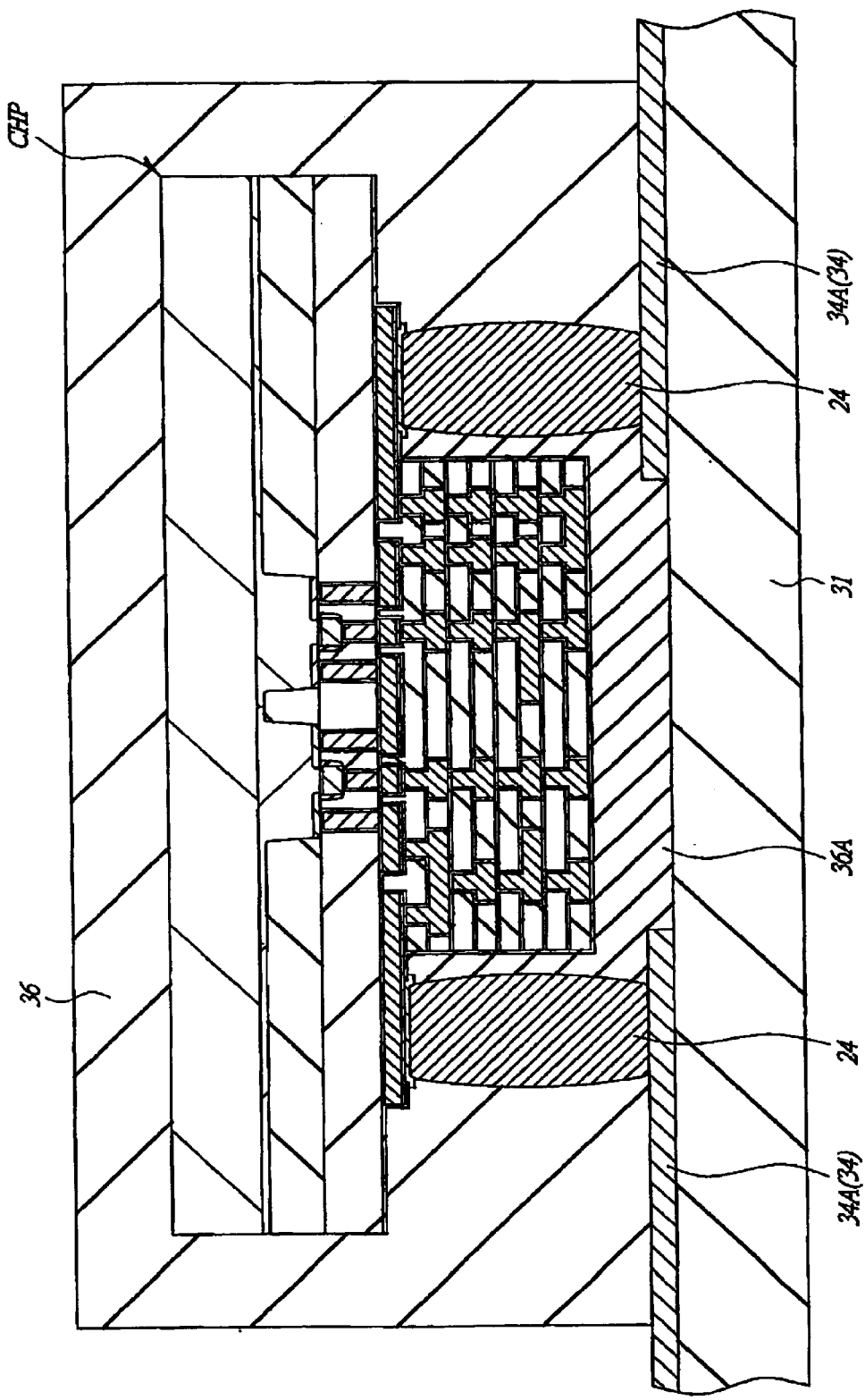
FIG. 19 is sectional view showing a principal portion of the semiconductor device in the manufacturing process according to the second embodiment of the present invention.

Also, as shown in FIG. 19, even if the insulation tape 31 from which the resin member 35 is omitted is used, similarly to the example described with reference to FIG. 17 in the first embodiment, the low stress resin 36A lower in a post-solidification stress than the resin 36 is preliminarily coated within a region where the semiconductor chip CHP on the insulation tape 31 is disposed before the semiconductor chip CHP is bonded to the insulation tape 31. Therefore, by bonding the semiconductor chip CHP to the insulation tape 31, the low stress resin 36A may be filled between the insulation tape 31 and the semiconductor chip CHP. Consequently, also in the second embodiment, while the stress exerted on the interlayer insulation films 15 and 17 (see FIG. 12) and the wiring layers (buried wirings 20 (see FIG. 12)) is relaxed, it is possible to prevent an aggregation of moisture from entering through the interface between the resin 36 and the lead 34.

Also in the case of the second embodiment, the same effects as those of the first embodiment can be obtained.

As described above, the invention made by the inventor has been concretely described based on the embodiments. However, needless to say, the present invention is not limited to the above-mentioned embodiments and can be variously modified and altered without departing from the gist thereof.

In the above-mentioned embodiments, the case where the plurality of interlayer insulation films are patterned by etching them in batch has been shown. However, the patterning may be carried out by etching per layer.

Effects obtained by the representative ones of inventions disclosed in this application will be briefly described as follows.

In the semiconductor device manufacturing process using the low-dielectric-constant insulation film as the interlayer insulation film (second insulation film), the stress exerted on the wiring layers and the interlayer insulation films can be reduced. Therefore, it is possible to prevent the disconnection of the wirings, the separation between the wirings and the interlayer insulation films, and the separation between the interlayer insulation films.

What is claimed is:

1. A manufacturing method of a semiconductor device, the method comprising the steps of:
   (a) forming a first insulation film over a semiconductor substrate;
   (b) forming a first wiring layer over said first insulation film;
   (c) forming, over said first wiring layer, a second insulation film lower in dielectric constant than said first insulation film;
   (d) forming a second wiring layer over said second insulation film;
   (e) removing said second insulation film within a first region surrounding said second wiring layer in plane, and using a bonding pad as a first wiring formed in said first region of said first wiring layer;
   (f) forming, over said bonding pad, a bump electrode electrically connected to said bonding pad;
   (g) after said step (f), cutting said semiconductor substrate along a division region to form individual semiconductor chips;
   (h) preparing an insulating tape, on a main surface of which a lead is formed, opposing a main surface of said semiconductor chip and said main surface of said insulation tape to each other, and disposing said semiconductor chip on said insulation tape so that said bump electrode is electrically connected to said lead; and
   (i) resin-sealing rear and side surfaces of said semiconductor chip so that said main surface of said semiconductor chip comes in no contact with a sealing resin under the condition that said semiconductor chip is disposed on said insulation tape.

2. The manufacturing method of a semiconductor device according to claim 1,
   wherein said first insulation film is formed as a main insulation layer composed of a silicone oxide system insulation film, and said second insulation film is formed as a main insulation layer composed of an insulation film relatively lower in dielectric constant than said silicone oxide system insulation film.

3. The manufacturing method of a semiconductor device according to claim 1,
   wherein said step (h) includes the step of filling, with a first resin smaller in stress than said sealing resin, a region between said main surface of said semiconductor chip and said main surface of said insulation tape.

4. The manufacturing method of the semiconductor device according to claim 1,
   wherein said insulation tape has a first means, which is provided in a region surrounding said first region in said main surface and prevents said sealing resin from entering into said main surface of said semiconductor chip.

5. The manufacturing method of the semiconductor device according to claim 4,
   wherein said step (h) includes the step of filling, with a first resin smaller in stress than said sealing resin, a region between said main surface of said semiconductor chip and said main surface of said insulation tape.

6. The manufacturing method of the semiconductor device according to claim 1, further comprising the step of:
   forming a plurality of wiring layers by repeating said step (c) and said step (d).

7. The manufacturing method of the semiconductor device according to claim 6,
   wherein said bump electrode is formed to become higher than a position where an uppermost wiring layer of said plurality of wiring layers is formed.

* * * * *